(12) United States Patent
Li et al.

(10) Patent No.: US 8,060,351 B2
(45) Date of Patent: Nov. 15, 2011

(54) DISPLAY DESIGN SYSTEM AND METHOD

(75) Inventors: I-Yin Li, Taipei (TW); Jean-Fu Kiang, Taipei (TW)

(73) Assignee: National Taiwan University (TW)

( * ) Notice: Subject to any disclaimer, the term of this patent is extended or adjusted under 35 U.S.C. 154(b) by 666 days.

(21) Appl. No.: 12/175,499

(22) Filed: Jul. 18, 2008

(65) Prior Publication Data

US 2009/0112553 A1    Apr. 30, 2009

(30) Foreign Application Priority Data

Oct. 30, 2007    (TW) ................................ 96140724 A
Jun. 24, 2008    (TW) ................................ 97123443 A

(51) Int. Cl.
     *G06F 17/50*          (2006.01)
(52) U.S. Cl. ......... 703/2; 716/4; 716/5; 345/14; 345/18; 345/45; 345/690; 378/98.8
(58) Field of Classification Search ...... 703/2; 716/4–8; 345/14, 18, 45, 590; 702/2; 378/98.8
See application file for complete search history.

(56) References Cited

U.S. PATENT DOCUMENTS

| | | | |
|---|---|---|---|
| 6,714,623 B2 * | 3/2004 | Sako et al. | 378/98.8 |
| 2002/0159567 A1 * | 10/2002 | Sako et al. | 378/117 |
| 2006/0007205 A1 * | 1/2006 | Reddy et al. | 345/204 |
| 2006/0007248 A1 * | 1/2006 | Reddy et al. | 345/690 |
| 2006/0007249 A1 * | 1/2006 | Reddy et al. | 345/690 |

\* cited by examiner

*Primary Examiner* — Thai Phan
(74) *Attorney, Agent, or Firm* — Schmeiser, Olsen & Watts, LLP

(57) ABSTRACT

An LCD display design system and method are disclosed. The method includes performing operations by a variety of operation modules after initial parameters are input and an operation type is selected, so as to generate operation results and transfer the operation results to an integration module; integrating the operation results by an integration module to generate a correspondence relation such as an operation window, a compare-table or an equation, and further transferring the operation results and the correspondence relation to an output module such that the output module can display performance variations of a variety of designs corresponding to the different initial parameters. Therefore, the present invention provides a user with a convenient way to obtain optimal design parameters for designing a display pixel circuit.

14 Claims, 3 Drawing Sheets

DISPLAY DESIGN SYSTEM AND METHOD

BACKGROUND OF THE INVENTION

1. Field of the Invention

The present invention relates generally to design systems and methods, and more particularly to an LCD (Liquid Crystal Display) pixel circuit design system and method.

2. Description of Related Art

A color filter liquid crystal display (CF-LCD) uses a white backlight module such as a cold cathode fluorescent lamp (CCFL) to provide a broad-spectrum light source with various wavelengths, which is selectively filtered in terms of color and position when passing through pixels of the display. In general, a pixel is composed of three sub-pixels, and the electric field intensity of each sub-pixel is controlled by a field-effect transistor (FET) so as to determine the light intensity passing through the sub-pixel. Using this design, the broad-spectrum light source passing through the sub-pixels is selectively filtered into primary color light corresponding to the sub-pixels by primary color filters corresponding to the sub-pixels respectively. The lights of primary colors are then mixed by the human eyes into a specific color associated with the pixel.

A field-sequential color liquid crystal display (FSC-LCD) directly modifies the light source configuration of the backlight module by replacing the white backlight module used in the CF-LCD with three primary color light sources. Therefore, the FSC-LCD no longer needs the color filters, and there is no need to divide each pixel into sub-pixels. In operation, the formation of color of the FSC-LCD is performed by modulating the light emitting clocks of three primary color light sources in the backlight module. Meanwhile, the FETs of the pixels are coordinated by the corresponding clocks to control the electric field intensity of the pixels so as to determine the light intensity passing through the pixels. As a result, the relative intensity of the primary color lights is regulated by synchronously controlling LCD pixel transmission. After the three primary color lights enter the viewer's eyes, the visual system performs an integration operation on the received light stimulus to mix the primary color lights into a single color matching the predetermined color of the pixel.

The field-sequential imaging technique and related products have already existed. For example, digital light processing (DLP) projectors have adopted this technique. However, some bottlenecks must be overcome before this technique is applicable to an LCD display.

In the display technology industry, frames need to be displayed at a rate above 60 Hz to meet the lowest changing rate required by the human visual system to successfully display a complete image, particularly a moving image. Because an CF-LCD uses a white backlight module and three primary color sub-pixel light filters for modulation, the CF-LCD can provide three primary color light sources at the same time and accordingly operate at the lowest changing rate (60 Hz). However, because an FSC-LCD uses three primary color time-changing backlight modules to replace a broad-spectrum light source, the switching frequency for the three primary color sources has to be three times that of the CF systems using broad-spectrum light source. In other words, the lowest changing rate of the FSC-LCD system must be 60 Hz multiplied by 3, i.e., 180 Hz so as to meet the lowest changing rate required by the human visual system to successfully display a complete image.

If the synchronization or response frequency of FSC-LCD is poor, color breakup (CBU) effect will appear and adversely affect the visual impression. From the above, it can be seen that finding a way to increase the changing rate is one of the most challenging issues involved in applying the field-sequential color imaging technique to LCD displays.

To increase the changing rate of an LCD system, not only the changing rate of the backlight but also the response of the display pixel circuit must meet the requirement of the lowest changing rate. In 1996, Tsukada proposed a design theory for LCD pixel circuits in "TFT/LCD Liquid-Crystal Displays Addressed by Thin-Film Transistors," $2^{nd}$ ed., Taylor & Francis, 2000, which takes into consideration the charging behavior, capacitor coupling effect and signal delay in designing the pixel circuits. Further, Y. H. Tai proposed in 2006 the concept of an operation window based on charging, holding, coupling and delay in "Design and Operation of TFT-LCD Panels," WuNan, 2006.

In addition to meeting the requirement of the lowest changing rate, taking into consideration the light transmission ratio of a pixel is another important design concept in designing an LCD pixel circuit. In the operation of an LCD, the amount of light passing through a pixel is controlled by voltage. And, if the pixel has a large light transmission area, the pixel can attain high light transmission so as to achieve a preferred display effect and reach a specific color and luminance standard with low power consumption and low cost. Y. Kaneko, A. Sasano, and T. Tsukada proposed in 1989 an equivalent circuit model used in designing pixel circuits of an LCD ("Analysis and design of a-Si TFT/LCD panels with a pixel model," IEEE Trans. Electron Dev., vol. 36, no. 12, pp. 2953-2958, December 1989). According to the equivalent circuit model, persons skilled in the art not only can ascertain the basic structure of a pixel circuit, but also can see that the pixel circuit has a large portion of light-impervious area.

In designing products, design conditions and constraints need to be considered at the same time. For example, comprehensively considering the design conditions and constraints such as charging/discharging behavior, voltage potential holding, capacitor coupling effect and signal delay is one of the most important challenges in designing a pixel circuit. However, until now, no design system has ever considered the above design parameters of the display pixel circuit at the same time to calculate and compare performance variations of a variety of designs with different design parameters, thereby helping a designer to select ideal design parameters in designing a display pixel circuit.

Therefore, there is a need to provide a display design system and method that can calculate and compare performance variations of a variety of designs corresponding to different design parameters so as to help a designer to select ideal design parameters for designing a display pixel circuit.

SUMMARY OF THE INVENTION

In view of the above drawbacks of the prior art, an object of the present invention is to provide a display design system and method to calculate, compare and display performance variations of a variety of designs corresponding to different design parameters.

Another object of the present invention is to provide a display design system and method that helps designers to select optimal design parameters in designing display pixel circuits.

In order to attain the above and other objects, the present invention provides a display design system applied to a data processing device, wherein the data processing device comprises: an input module for inputting initial parameters, selecting an operation type and selecting an output form, and an output module for displaying output results. The display design system at least comprises: a capacitor charging operation module for performing operations in accordance with its operation rule after receiving the initial parameters input to the input module so as to generate an operation result regarding capacitor charging; a potential holding operation module for performing operations in accordance with its operation rule after receiving the initial parameters input to the input module so as to generate an operation result regarding potential holding; a capacitor coupling operation module for performing operations in accordance with its operation rule after receiving the initial parameters input to the input module so as to generate an operation result regarding capacitor coupling; a signal delaying operation module for performing operations in accordance with its operation rule after receiving the initial parameters input to the input module so as to generate an operation result regarding signal delaying; and an integration module for receiving the operation results from the capacitor charging operation module, the potential holding operation module, the capacitor coupling operation module and the signal delaying operation module, and comparing the operation results in accordance with the selected operation type and the output form so as to generate a corresponding relation of the operation results and further transfer the operation results and the corresponding relation to the output module.

The present invention further provides a display design method applied to a data processing device, wherein the data processing device comprises: an input module for inputting initial parameters, selecting an operation type and selecting an output form, and an output module for displaying output results. The display design method at least comprises: inputting the initial parameters, the operation type and the output form to the input module; transferring the initial parameters from the input module to a capacitor charging operation module, a potential holding operation module, a capacitor coupling operation module and a signal delaying operation module, and transferring the output form and the operation type to an integration module; performing operations on the initial parameters in accordance with the operation rules of the capacitor charging operation module, the potential holding operation module, the capacitor coupling operation module and the signal delaying operation module so as to generate operation results corresponding to the operation modules, respectively, and transferring the operation results to the integration module; comparing the received operation results using the integration module in accordance with the operation type and the output form and generating a corresponding relation of the operation results, and transferring the operation results and the corresponding relation to the output module; and displaying the operation results and the corresponding relation via the output module.

According to the present invention, after the initial parameters are input and the operation type is selected, the operation modules of the display design system perform operations according to their operations rules to generate operation results and further transfer the operation results to the integration module. Then, the integration module integrates the operation results and generates a corresponding relation such as an operation window, a compare-table or an equation, and further transfers the operation results and the corresponding relation to the output module, whereupon the output module displays performance variations of a variety of designs associated with the initial parameters. Therefore, the present invention provides users with a convenient way to obtain optimal design parameters for designing a display pixel circuit.

DETAILED DESCRIPTION OF PREFERRED EMBODIMENTS

The following illustrative embodiments are provided to illustrate the disclosure of the present invention. These and other advantages and effects will be apparent to those skilled in the art after reading the disclosure of this specification.

Figure 1:
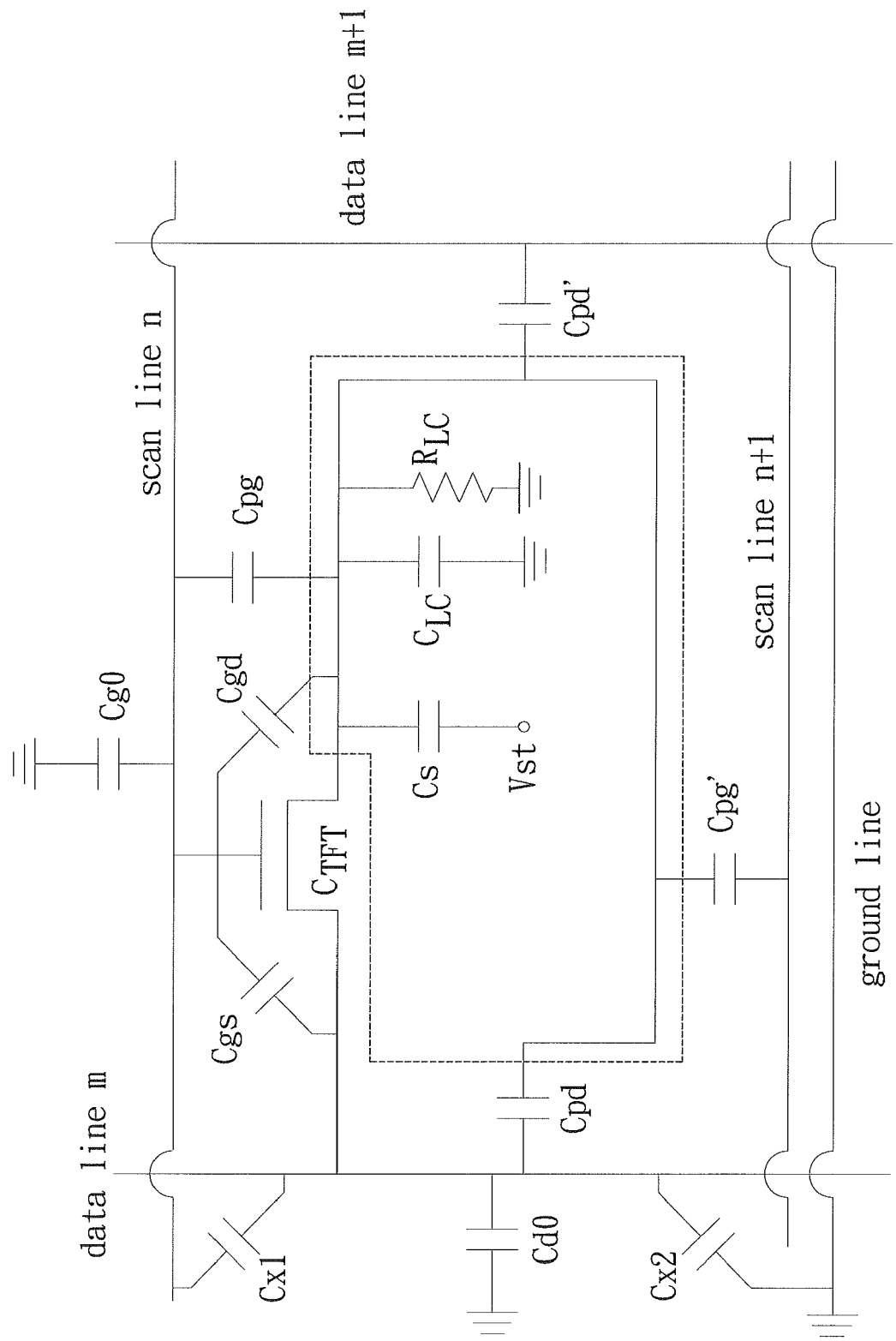
FIG. 1 is an equivalent circuit diagram of an LCD pixel.
Figure 2:
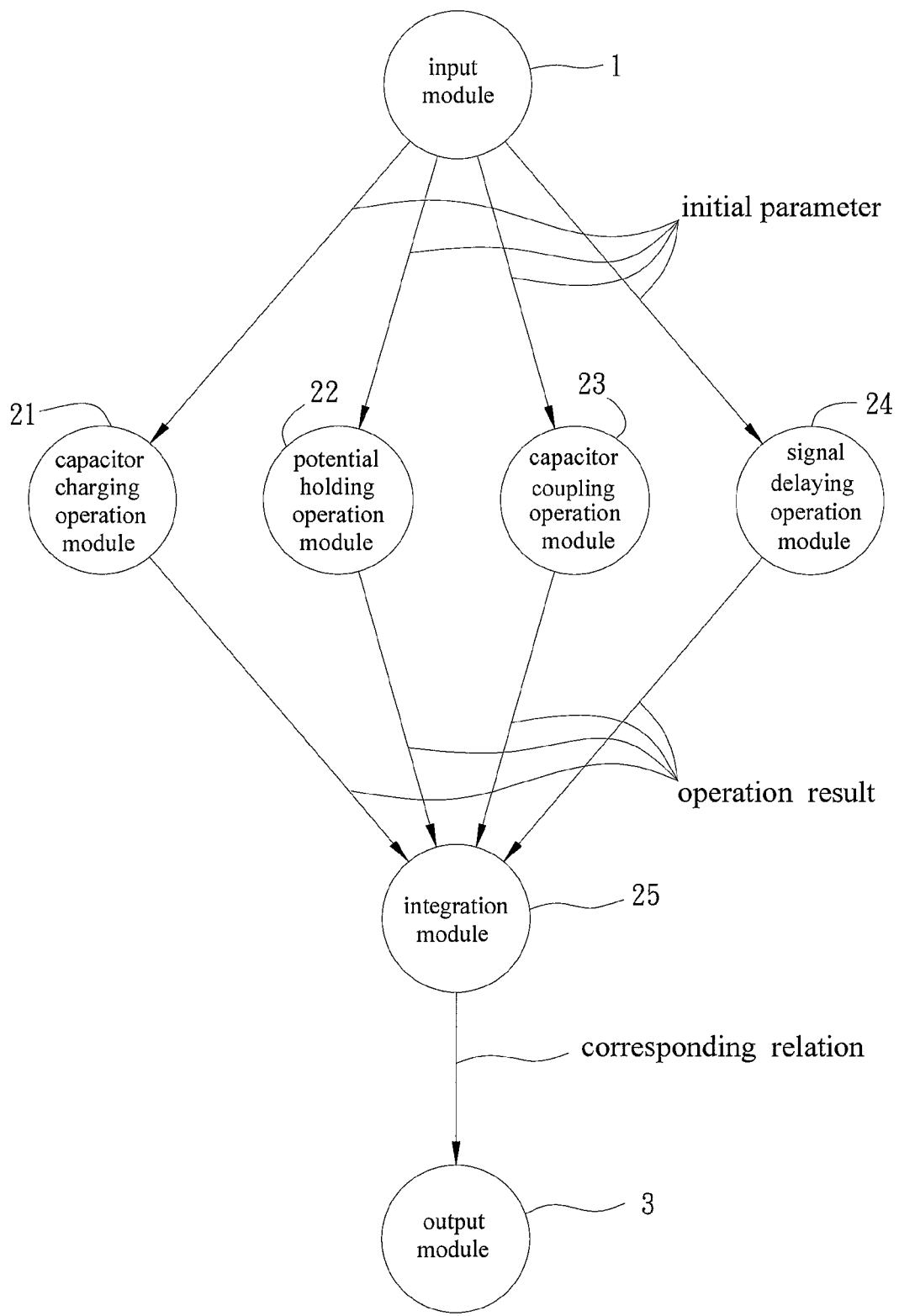
FIG. 2 is a functional block diagram of a display design system according to the present invention.

FIG. 1 is an equivalent circuit diagram of an LCD pixel and FIG. 2 is a functional block diagram of a display design system according to the present invention.

As shown in the drawings, the display design system according to the present invention is applied to a data processing device, wherein the data processing device at least comprises: an input module 1 for inputting initial parameters, selecting an operation type and selecting an output form, and an output module 3 for displaying output results. The display design system according to the present invention comprises a capacitor charging operation module 21, a potential holding operation module 22, a capacitor coupling operation module 23, and a signal delaying operation module 24.

The capacitor charging operation module 21 receives the initial parameters input to the input module 1, and then performs operation in accordance with the following equation:

$$\frac{W}{L} > \frac{C_{px} \cdot k_t}{\mu_{eff} C_g (V_s - V_t - V_d)(T_{row} - T_{delay})}$$

so as to generate an operation result regarding capacitor charging and transfer the operation result to the integration module 25, wherein W represents the channel width of the pixel transistor, L represents the channel length of the pixel transistor, $\mu_{eff}$ represents the equivalent carrier mobility, $k_t$ represents a normalized charging rise time, $C_{px}$ represents the capacitance of capacitor $C_{px}$, $C_g$ represents the capacitance of capacitor $C_g$, $V_s$ represents the voltage of a scan line, $V_d$ represents the voltage of a data line, $V_t$ represents an LCD voltage threshold value, $T_{row}$ represents time allocated for displaying a row of pixels, and $T_{delay}$ represents acceptable time delay along a scan line.

The potential holding operation module 22 receives the initial parameters input to the input module 1, and then performs operation in accordance with the following equation:

$$\frac{W}{L} < \frac{C_{px}}{T_{frame} 2^{N_{bit}} \sigma_D t_{semi}}$$

so as to generate an operation result regarding potential holding and transfer the operation result to the integration module 25, wherein W represents the channel width of the pixel transistor, L represents the channel length of the pixel transistor, $C_{px}$ represents the capacitance of capacitor $C_{px}$, $T_{frame}$ represents time allocated for displaying a frame, $N_{bit}$ represents the number of bits for storing information for a pixel, $\sigma_D$ represents the dark conductivity of the semiconductor layer, and $t_{semi}$ represents the thickness of the semiconductor layer.

The capacitor coupling operation module 23 receives the initial parameters input to the input module 1, and then performs operation in accordance with the following equation:

$$W < \frac{\left[\frac{2(C_{LC,min} + C_s)(C_{LC,max} + C_s)F_{kb}}{(v_{s,ON} - v_{s,OFF})(C_{LC,max} - C_{LC,min})}\right] - C_{pg}}{\tilde{C}_{gd}}$$

so as to generate an operation result regarding capacitor coupling and transfer the operation result to the integration module 25, wherein W represents the channel width of the pixel transistor, $C_{LC,min}$ represents the minimum capacitance of capacitor $C_{LC}$, $C_{LC,max}$ represents the maximum capacitance of the capacitor $C_{LC}$, $C_s$ represents the capacitance of capacitor $C_s$, $F_{kb}$ represents the acceptable residual voltage threshold, $v_{s,ON}$ represents the voltage of a scan line at ON state, $v_{s,OFF}$ represents the voltage of a scan line at OFF state, $C_{pg}$ represents the capacitance of capacitor $C_{pg}$, and $\tilde{C}_{gd}$ represents the capacitance of capacitor $C_{gd}$ divided by the channel width W of the pixel transistor, that is, $C_{gd} = \tilde{C}_{gd}W$.

The signal delaying operation module 24 receives the initial parameters input to the input module 1, and then performs operation in accordance with the following equations:

$$W < \frac{(T_{delay}/1.03N_{data}^2 R_{scan}) - (C_{g0} + C_{x1} + C_{pg} + C_{pg'})}{2\tilde{C}_{gd} + \varepsilon_{insu}\varepsilon_0 L/t_{insu}} \text{ and}$$

$$W < \frac{(T_{delay}/1.03N_{scan}^2 R_{data}) - (C_{x1} + C_{x2} + C_{d0} + C_{pd} + C_{pd'})}{\tilde{C}_{gd}}$$

so as to generate an operation result regarding signal delaying and transfer the operation result to the integration module 25, wherein W represents the channel width of the pixel transistor, $N_{data}$ represents the number of pixels along a scan line, $R_{scan}$ represents the resistance of a scan line across a pixel, $T_{delay}$ represents the acceptable time delay along a scan line, $N_{scan}$ represents the number of pixels along a data line, $R_{data}$ represents the resistance of a data line across a pixel, $\tilde{C}_{gd}$ represents the capacitance of capacitor $C_{gd}$ divided by the channel width W of the pixel transistor, that is, $C_{gd} = \tilde{C}_{gd}W$, L represents the channel length of the pixel transistor, $\varepsilon_{insu}$ and $t_{insu}$ represent the dielectric constant and thickness of the dielectric layer, respectively, $C_{TFT} = \varepsilon_{insu}\varepsilon_0 WL/t_{insu}$ represents the capacitance of the pixel transistor, $C_{x1}$ represents the capacitance of capacitor $C_{x1}$, $C_{x2}$ represents the capacitance of capacitor $C_{x2}$, $C_{d0}$ represents the capacitance of capacitor $C_{d0}$, $C_{pd}$ represents the capacitance of capacitor $C_{pd}$, $C_{pd'}$ represents the capacitance of capacitor $C_{pd'}$, $C_{g0}$ represents the capacitance of capacitor $C_{g0}$, $C_{pg}$ represents the capacitance of capacitor $C_{pg}$, and $C_{pg'}$ represents the capacitance of capacitor $C_{pg'}$.

The integration module 25 receives the operation type and the output form input to the input module 1 and the operation results generated by the capacitor charging operation module 21, the potential holding operation module 22, the capacitor charging operation module 23 and the signal delaying operation module 24, and captures needed operation results in accordance with the selected operation type and the selected output form so as to generate a corresponding relation such as an operation window, a compare-table or an equation and transfer the corresponding relation to the output module 3.

When the operation window is displayed as the selected type for the operation results, the integration module 25 captures needed operation results in accordance with the selected operation type and shows the needed operation results by drawing an operation area in a coordinate system and transfers the operation area to the output module 3, thereby providing a user with a convenient way to obtain optimal design parameters for designing a display pixel circuit.

Figure 3:
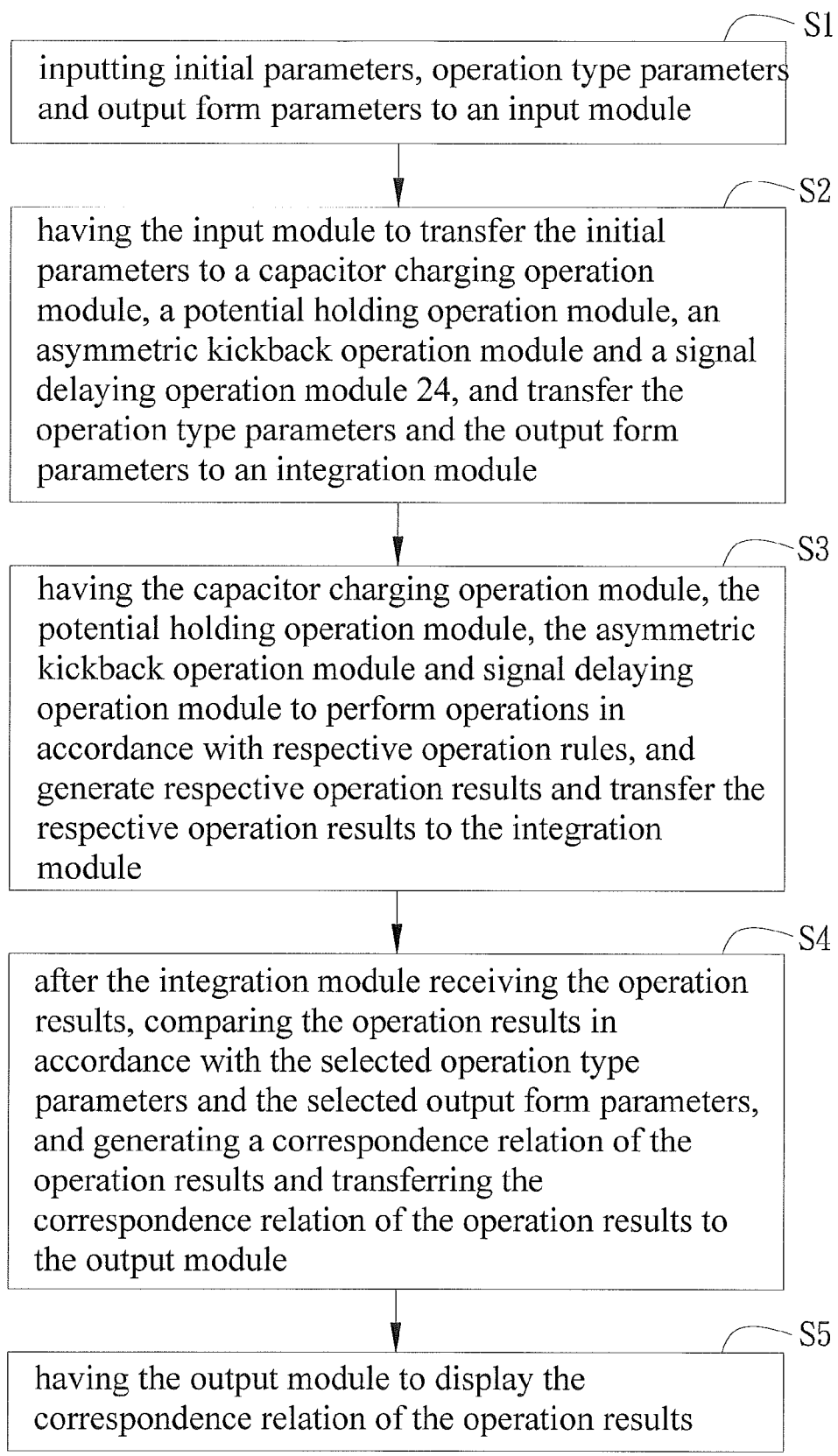
FIG. 3 is a flow chart of a display design method according to the present invention.

FIG. 3 is a flow chart of a display design method according to the present invention. As shown in FIG. 3, the method at least comprises the following steps. First, in step S1, initial parameters, an operation type and an output form are input to the input module 1. Then, The process goes to step S2.

In step S2, the input module 1 transfers the initial parameters to the capacitor charging operation module 21, the potential holding operation module 22, the capacitor coupling operation module 23 and the signal delaying operation module 24, and transfers the operation type and the output form to the integration module 25. Then, the process goes to step S3.

In step S3, the capacitor charging operation module 21, the potential holding operation module 22, the capacitor coupling operation module 23 and the signal delaying operation module 24 perform operations in accordance with their respective operation rules so as to generate respective operation results and transfer the respective operation results to the integration module 25. Then, the process goes to step S4.

In step S4, the integration module 25 receives the operation results, generates a correspondence relation of the operation results in accordance with the selected operation type and the selected output form, and transfers the correspondence relation and the operation results to the output module 3. Then, the process goes to step S5.

In step S5, the output module 3 displays the operation results and the correspondence relation.

According to the display design system and method of the present invention, after the initial parameters are input and the operation type and output form are selected, the operation modules of the display design system perform operations according to their respective operation rules so as to generate respective operation results and transfer the operation results to the integration module 25. Then, the integration module 25 integrates the operation results according to the selected operation type and output form and generates a correspondence relation such as an operation window, a compare-table or an equation, and further transfers the operation results and the correspondence relation of the operation results to the output module, whereupon the output module displays performance variations of a variety of designs associated with the initial parameters. Therefore, the present invention provides users with a convenient way to obtain optimal design parameters for designing a display pixel circuit.

The above-described description of the detailed embodiment is only to illustrate the preferred implementation according to the present invention, and is not intended to limit the scope of the present invention. Accordingly, various modifications and variations completed by those with ordinary skill in the art should be considered to fall within the scope of present invention as defined by the appended claims.

What is claimed is:

1. A display design system applied to a data processing device, wherein the data processing device comprises an input module for inputting initial parameters, selecting an operation type and selecting an output form, and an output module for displaying output results, the display design system comprising:

a capacitor charging operation module for performing operation in accordance with its operation rule after receiving the initial parameters input to the input module, so as to generate an operation result regarding capacitor charging;

a potential holding operation module for performing operation in accordance with its operation rule after receiving the initial parameters input to the input module, so as to generate an operation result regarding potential holding;

a capacitor coupling operation module for performing operation in accordance with an operation rule after receiving the initial parameters input to the input module, so as to generate an operation result regarding capacitor coupling;

a signal delay operation module for performing operation in accordance with an operation rule after receiving the initial parameters input to the input module, so as to generate an operation result regarding signal delay; and an integration module for receiving the operation results from the capacitor charging operation module, the potential holding operation module, the capacitor coupling operation module and the signal delay operation module, and comparing the operation results in accordance with the selected operation type and the selected output form, so as to generate a correspondence relation of the operation results and transfer the operation results and the correspondence relation to the output module.

2. The display design system of claim 1, wherein the operation rule of the capacitor charging operation module at least comprises the following equation:

$$\frac{W}{L} > \frac{C_{px} \cdot k_t}{\mu_{eff} C_g (V_s - V_t - V_d)(T_{row} - T_{delay})},$$

wherein W represents the channel width of the pixel transistor, L represents the channel length of the pixel transistor, $\mu_{eff}$ represents the equivalent carrier mobility, $k_t$ represents a normalized charging rise time, $C_{px}$ represents the capacitance of capacitor $C_{px}$, $C_g$ represents the capacitance of capacitor $C_g$, $V_s$ represents the voltage of a scan line, $V_d$ represents the voltage of a data line, $V_t$ represents an LCD voltage threshold value, $T_{row}$ represents time allocated for displaying a row of pixels, and $T_{delay}$ represents acceptable time delay along a scan line.

3. The display design system of claim 1, wherein the operation rule of the potential holding operation module at least comprises the following equation:

$$\frac{W}{L} < \frac{C_{px}}{T_{frame} 2^{N_{bit}} \sigma_D t_{semi}},$$

wherein W represents the channel width of the pixel transistor, L represents the channel length of the pixel transistor, $C_{px}$ represents the capacitance of capacitor $C_{px}$, $T_{frame}$ represents time allocated for displaying a frame, $N_{bit}$ represents the number of bits for storing information for a pixel, $\sigma_D$ represents the dark conductivity of the semiconductor layer, and $t_{semi}$ represents the thickness of the semiconductor layer.

4. The display design system of claim 1, wherein the operation rule of the capacitor coupling operation module at least comprises the following equation:

$$W < \frac{\left[\frac{2(C_{LC,min} + C_s)(C_{LC,max} + C_s)F_{kb}}{(v_{s,ON} - v_{s,OFF})(C_{LC,max} - C_{LC,min})}\right] - C_{pg}}{\tilde{C}_{gd}},$$

wherein W represents the channel width of the pixel transistor, $C_{LC,min}$ represents the minimum capacitance of capacitor $C_{LC}$, $C_{LC,max}$ represents the maximum capacitance of the capacitor $C_{LC}$, $C_s$ represents the capacitance of capacitor $C_s$, $F_{kb}$ represents the acceptable residual voltage threshold, $v_{s,ON}$ represents the voltage of a scan line at ON state, $v_{s,OFF}$ represents the voltage of a scan line at OFF state, $C_{pg}$ represents the capacitance of capacitor $C_{pg}$, and $\tilde{C}_{gd}$ represents the capacitance of capacitor $C_{gd}$ divided by the channel width W of the pixel transistor, that is, $C_{gd} = \tilde{C}_{gd} W$.

5. The display design system of claim 1, wherein the operation rule of the signal delaying operation module at least comprises the following equations:

$$W < \frac{(T_{delay}/1.03 N_{data}^2 R_{scan}) - (C_{g0} + C_{x1} + C_{pg} + C_{pg'})}{2\tilde{C}_{gd} + \varepsilon_{insu} \varepsilon_0 L / t_{insu}} \text{ and}$$

$$W < \frac{(T_{delay}/1.03 N_{scan}^2 R_{data}) - (C_{x1} + C_{x2} + C_{d0} + C_{pd} + C_{pd'})}{\tilde{C}_{gd}}$$

wherein W represents the channel width of the pixel transistor, $N_{data}$ represents the number of pixels along a scan line, $R_{scan}$ represents the resistance of a scan line across a pixel, $T_{delay}$ represents the acceptable time delay along a scan line, $N_{scan}$ represents the number of pixels along a data line, $R_{data}$ represents the resistance of a data line across a pixel, $\tilde{C}_{gd}$ represents the capacitance of capacitor $C_{gd}$ divided by the channel width W of the pixel transistor, that is, $C_{gd} = \tilde{C}_{gd} W$, L represents the channel length of the pixel transistor, $\varepsilon_{insu}$ and $t_{insu}$ represent the dielectric constant and thickness of the dielectric layer, respectively, $C_{TFT} = \varepsilon_{insu} \varepsilon_0 WL/t_{insu}$ represents the capacitance of the pixel transistor, $C_{x1}$ represents the capacitance of capacitor $C_{x1}$, $C_{x2}$ represents the capacitance of capacitor $C_{x2}$, $C_{d0}$ represents the capacitance of capacitor $C_{d0}$, $C_{pd}$ represents the capacitance of capacitor $C_{pd}$, $C_{pd'}$ represents the capacitance of capacitor $C_{pd'}$, $C_{g0}$ represents the capacitance of capacitor $C_{g0}$, $C_{pg}$ represents the capacitance of capacitor $C_{pg}$, and $C_{pg'}$ represents the capacitance of capacitor $C_{pg'}$.

6. The display design system of claim 1, wherein the integration module integrates the operation results and then generates the correspondence relation of an operation window, a compare-table or an equation.

7. The display design system of claim 6, wherein, when the operation window is displayed as the correspondence relation, the integration module captures needed operation results in accordance with the selected operation type and shows the operation results by drawing an operation area in a coordinate system.

8. A display design method applied to a data processing device, wherein the data processing device comprises an input module for inputting initial parameters, selecting an operation type and selecting an output form, and an output module for displaying the output results, the display design method at least comprising:

inputting the initial parameters, the operation type and the output form to the input module;

transferring the initial parameters from the input module to a capacitor charging operation module, a potential holding operation module, a capacitor coupling operation module and a signal delaying operation module, and transferring the output form and the operation type to an integration module;

performing operations on the initial parameters in accordance with respective operation rules of the capacitor charging operation module, the potential holding operation module, the capacitor coupling operation module and the signal delaying operation module, so as to generate operation results corresponding to the operation modules, respectively, and transferring the operation results to the integration module;

comparing the operation results using the integration module in accordance with the operation type and the output form and generating a correspondence relation of the operation results, and transferring the operation results and the correspondence relation to the output module; and displaying the operation results and the correspondence relation via the output module.

9. The display design method of claim 8, wherein the operation rule of the capacitor charging operation module at least comprises the following equation:

$$\frac{W}{L} > \frac{C_{px} \cdot k_t}{\mu_{eff} C_g (V_s - V_t - V_d)(T_{row} - T_{delay})},$$

wherein W represents the channel width of the pixel transistor, L represents the channel length of the pixel transistor, $\mu_{eff}$ represents the equivalent carrier mobility, $k_t$ represents a normalized charging rise time, $C_{px}$ represents the capacitance of capacitor $C_{px}$, $C_g$ represents the capacitance of capacitor $C_g$, $V_s$ represents the voltage of a scan line, $V_d$ represents the voltage of a data line, $V_t$ represents a LCD voltage threshold value, $T_{row}$ represents time allocated for displaying a row of pixels, and $T_{delay}$ represents acceptable time delay along a scan line.

10. The display design method of claim 8, wherein the operation rule of the potential holding operation module at least comprises the following equation:

$$\frac{W}{L} < \frac{C_{px}}{T_{frame} 2^{N_{bit}} \sigma_D t_{semi}},$$

wherein W represents the channel width of the pixel transistor, L represents the channel length of the pixel transistor, $C_{px}$ represents the capacitance of capacitor $C_{px}$, $T_{frame}$ represents time allocated for displaying a frame, $N_{bit}$ represents the number of bits for storing information for a pixel, $\sigma_D$ represents the dark conductivity of the semiconductor layer, and $t_{semi}$ represents the thickness of the semiconductor layer.

11. The display design method of claim 8, wherein the operation rule of the capacitor coupling operation module at least comprises the following equation:

$$W < \frac{\left[\frac{2(C_{LC,min} + C_s)(C_{LC,max} + C_s)F_{kb}}{(v_{s,ON} - v_{s,OFF})(C_{LC,max} - C_{LC,min})}\right] - C_{pg}}{\tilde{C}_{gd}}$$

wherein W represents the channel width of the pixel transistor, $C_{LC,min}$ represents the minimum capacitance of capacitor $C_{LC}$, $C_{LC,max}$ represents the maximum capacitance of the capacitor $C_{LC}$, $C_s$ represents the capacitance of capacitor $C_s$, $F_{kb}$ represents the acceptable residual voltage threshold, $v_{s,ON}$ represents the voltage of a scan line at ON state, $v_{s,OFF}$ represents the voltage of a scan line at OFF state, $C_{pg}$ represents the capacitance of capacitor $C_{pg}$, and $\tilde{C}_{gd}$ represents the capacitance of capacitor $C_{gd}$ divided by the channel width W of the pixel transistor, that is, $C_{gd} = \tilde{C}_{gd} W$.

12. The display design method of claim 8, wherein the operation rule of the signal delaying operation module at least comprises the following equations:

$$W < \frac{(T_{delay}/1.03 N_{data}^2 R_{scan}) - (C_{g0} + C_{x1} + C_{pg} + C_{pg'})}{2\tilde{C}_{gd} + \varepsilon_{insu}\varepsilon_0 L / t_{insu}} \text{ and}$$

$$W < \frac{(T_{delay}/1.03 N_{scan}^2 R_{data}) - (C_{x1} + C_{x2} + C_{d0} + C_{pd} + C_{pd'})}{\tilde{C}_{gd}}$$

wherein W represents the channel width of the pixel transistor, $N_{data}$ represents the number of pixels along a scan line, $R_{scan}$ represents the resistance of a scan line across a pixel, $T_{delay}$ represents the acceptable time delay along a scan line, $N_{scan}$ represents the number of pixels along a data line, $R_{data}$ represents the resistance of a data line across a pixel, $\tilde{C}_{gd}$ represents the capacitance of capacitor $C_{gd}$ divided by the channel width W of the pixel transistor, that is, $C_{gd} = \tilde{C}_{gd} W$, L represents the channel length of the pixel transistor, $\delta_{insu}$ and $t_{insu}$ represent the dielectric constant and thickness of the dielectric layer, respectively, $C_{TFT} = \varepsilon_{insu}\varepsilon_0 WL/t_{insu}$ represents the capacitance of the pixel transistor, $C_{x1}$ represents the capacitance of capacitor $C_{x1}$, $C_{x2}$ represents the capacitance of capacitor $C_{x2}$, $C_{d0}$ represents the capacitance of capacitor $C_{d0}$, $C_{pd}$ represents the capacitance of capacitor $C_{pd}$, $C_{pd'}$ represents the capacitance of capacitor $C_{pd'}$, $C_{g0}$ represents the capacitance of capacitor $C_{g0}$, $C_{pg}$ represents the capacitance of capacitor $C_{pg}$, and $C_{pg'}$ represents the capacitance of capacitor $C_{pg'}$.

13. The display design method of claim 8, wherein the integration module integrates the operation results and then generates the correspondence relation of an operation window, a compare-table, or an equation.

14. The display design method of claim 13 further comprising capturing needed operation results in accordance with the operation type via the integration module and showing the needed operation results by drawing an operation area in a coordinate system when the operation window is displayed as the correspondence relation.

* * * * *